(12) United States Patent
Haldar et al.

(10) Patent No.: US 8,605,539 B2
(45) Date of Patent: Dec. 10, 2013

(54) HARDWARE-BASED DATA EYE TRAINING FOR HIGH SPEED LINKS

(75) Inventors: Aniruddha Haldar, West Bengal (IN); Srinivas Eppa, Bangalore (IN); Venkatesh Deshpande, Bangalore (IN); Srinivas Vura, San Jose, CA (US); Shanmugavel Murugesan, Bangalore (IN)

(73) Assignee: LSI Corporation, San Jose, CA (US)

( * ) Notice: Subject to any disclaimer, the term of this patent is extended or adjusted under 35 U.S.C. 154(b) by 300 days.

(21) Appl. No.: 13/210,721

(22) Filed: Aug. 16, 2011

(65) Prior Publication Data

US 2013/0044796 A1 Feb. 21, 2013

(51) Int. Cl.
*G11C 8/00* (2006.01)

(52) U.S. Cl.
USPC ........................ 365/233.13; 365/193; 365/194

(58) Field of Classification Search
USPC ..................................... 365/233.13, 194, 193
See application file for complete search history.

(56) References Cited

U.S. PATENT DOCUMENTS 7,443,741 B2 * 10/2008 Butt et al. .................... 365/193

* cited by examiner

*Primary Examiner* — Son Dinh
(74) *Attorney, Agent, or Firm* — Ryan, Mason & Lewis, LLP

(57) ABSTRACT

Hardware-based methods and apparatus are provided for training high speed data links used in data transfer applications. A data valid window is calibrated on one or more high speed links by determining an offset delay value for at least one datapath using a finite state machine, wherein the offset delay value is based on a maximum offset delay value and a minimum offset delay value for the at least one datapath; and delaying a read data strobe signal based upon a base delay and the offset delay value for the at least one datapath. The offset delay value can be, for example, an average of the maximum offset delay and the minimum offset delay. The received pattern can be a predefined pattern or a programmable pattern. In addition, the received pattern can cover single-bit transitions and/or multi-bit transitions.

26 Claims, 8 Drawing Sheets

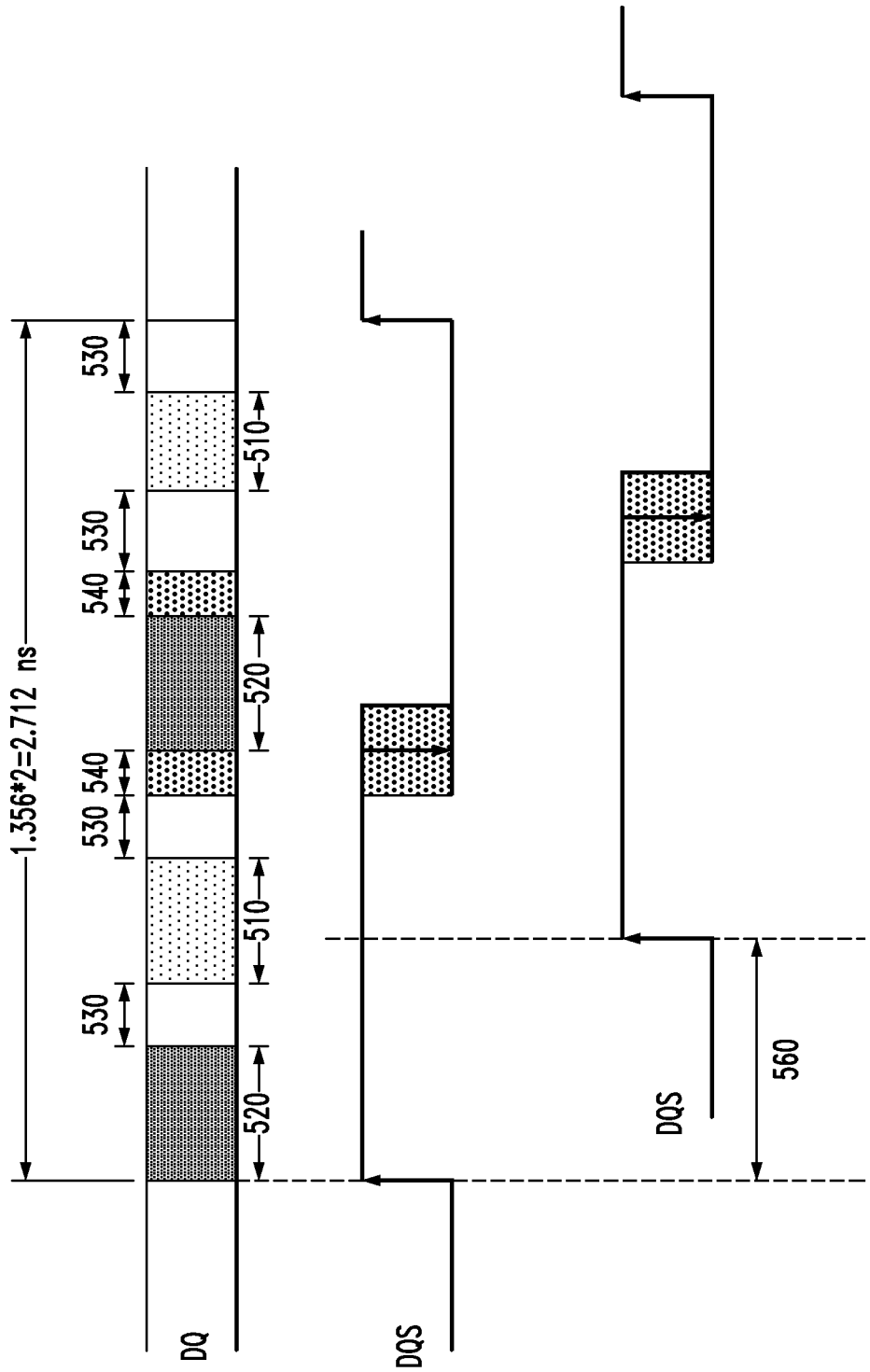

HARDWARE-BASED DATA EYE TRAINING FOR HIGH SPEED LINKS

FIELD OF THE INVENTION

The present invention relates generally to data eye training of data links and, more particularly, to hardware-based techniques for data eye training of data links, such as High-Speed Transceiver Logic (HSTL) links, used in data transfer applications.

BACKGROUND OF THE INVENTION

High speed data links are often used to interface between different system components. For example, high speed data links may be used to interface between a memory controller and a double data rate (DDR) synchronous dynamic random access memory (SDRAM) device. A DDR SDRAM interface may receive aligned data (DQ) and read data strobe (DQS) signals from a DDR SDRAM device for transfer to a memory controller. The DDR SDRAM interface is responsible for providing the appropriate DQ-DQS timing relationship to provide, for example, an adequate setup and hold time margin within a data valid window. The DQ-DQS timing alignment process may require a handshake mechanism to control the start of the data streaming and training patterns. For example, for data streaming applications, the DQS strobe signal toggles continuously, and there needs to be a proper handshake after a reset between the high speed interface and the DDR memory.

U.S. Pat. No. 7,443,741, entitled "DQS Strobe Centering (Data Eye Training) Method," discloses a software-based method for calibrating a data valid window for DDR memory applications. Generally, the disclosed calibration method maintains the read data strobe (DQS) substantially in the center of a defined data valid window. In some environments, however, such as non-memory applications, including data streaming applications, a controller or other processor may not be available to execute the software-based calibration method or may not have access to the high speed data on the data links.

A need therefore exists for hardware-based methods and apparatus for training high speed data links, such as High-Speed Transceiver Logic (HSTL) links, used in data transfer applications. A further need exists for hardware-based techniques for training the high speed data links that can be employed even if a controller is available to reduce the time for date eye training, relative to software-based calibration methods. Yet another need exists for hardware-based data eye training for data streaming applications that is programmable to meet skew and jitter requirements of a given platform and to support different training patterns.

SUMMARY OF THE INVENTION

Generally, hardware-based methods and apparatus are provided for training high speed data links used in data transfer applications. According to one aspect of the invention, a data valid window is calibrated on one or more high speed links by determining an offset delay value for at least one datapath using a finite state machine, wherein the offset delay value is based on a maximum offset delay value and a minimum offset delay value for the at least one datapath; and delaying a read data strobe signal based upon a base delay and the offset delay value for the at least one datapath.

The offset delay value can be, for example, an average of the maximum offset delay and the minimum offset delay. The minimum offset delay value can be obtained by setting a delay value of the datapath to a predetermined value; evaluating a received pattern using the delay value; incrementing the delay value by a predetermined amount; and repeating the steps of evaluating and incrementing until the evaluation test passes. The maximum offset delay value can be obtained by setting a delay value of the datapath to a predetermined value; evaluating a received pattern using the delay value; incrementing the delay value by a predetermined amount; and repeating the steps of evaluating and incrementing until the evaluation test fails. The predetermined value for determining the maximum offset delay value can be obtained from the minimum offset delay value (or vice versa).

The received pattern can be, for example, a predefined pattern or a programmable pattern. In addition, the received pattern can optionally cover single-bit transitions and or multi-hit transitions.

The finite state machine can recover from an error by returning to an idle state. The finite state machine optionally provides its state upon request. The finite state machine can optionally be retrained it one or more predefined conditions are satisfied.

According to a further aspect of the invention, a data valid window can be calibrated for at least a second datapath, substantially in parallel to the first datapath.

A more complete understanding of the present invention, as well as further features and advantages of the present invention, will be obtained by reference to the following detailed description and drawings.

DESCRIPTION OF THE DRAWINGS

FIGS. 5A and 5B illustrate exemplary DQ and DQS signals for the situation where the DQS signal is leading and lagging the DQ signal, respectively;

DETAILED DESCRIPTION

Figure 1:
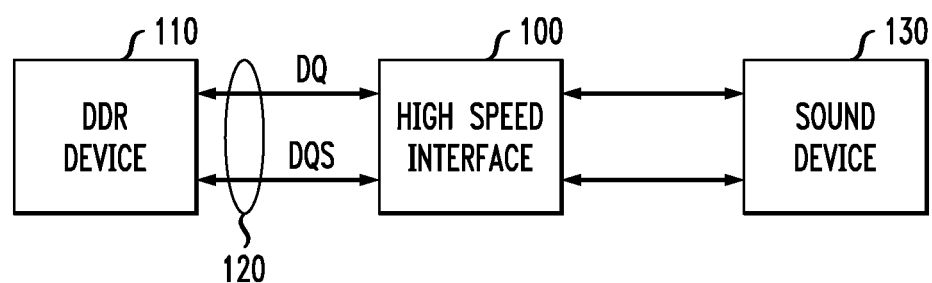
FIG. 1 illustrates an exemplary environment in which the present invention can be implemented.

The present invention provides hardware-based methods and apparatus for training high speed data links, such as HSTL links, used in data transfer applications. The hardware-based method for calibrating a data valid window is implemented, for example, in training and control logic of a high speed interface. FIG. 1 illustrates an exemplary environment in which the present invention can be implemented. As shown in FIG. 1, an exemplary embodiment of the present invention provides a high speed interface 100 that communicates with a DDR device 110 over high speed data links 120, such as HSTL links. While the present invention is illustrated in the context of an interface for a DDR device, other devices may be employed, as would be apparent to a person of ordinary skill in the art.

The high speed interface 100 receives unaligned data (DQ) and read data strobe (DQS) signals from the DDR device 110 for transfer to a second device 130. In one embodiment, discussed further below in conjunction with FIG. 2, the DDR device 110 may be embodied as a combiner/antenna implemented on a Field Programmable Gate Array (FPGA) device and the second device 130 may be embodied as a RAKE receiver. The high speed interface 100 may be implemented, for example, as a DDR PHY and may serve as a physical interface between, for example, a DDR device and another device.

Figure 2:
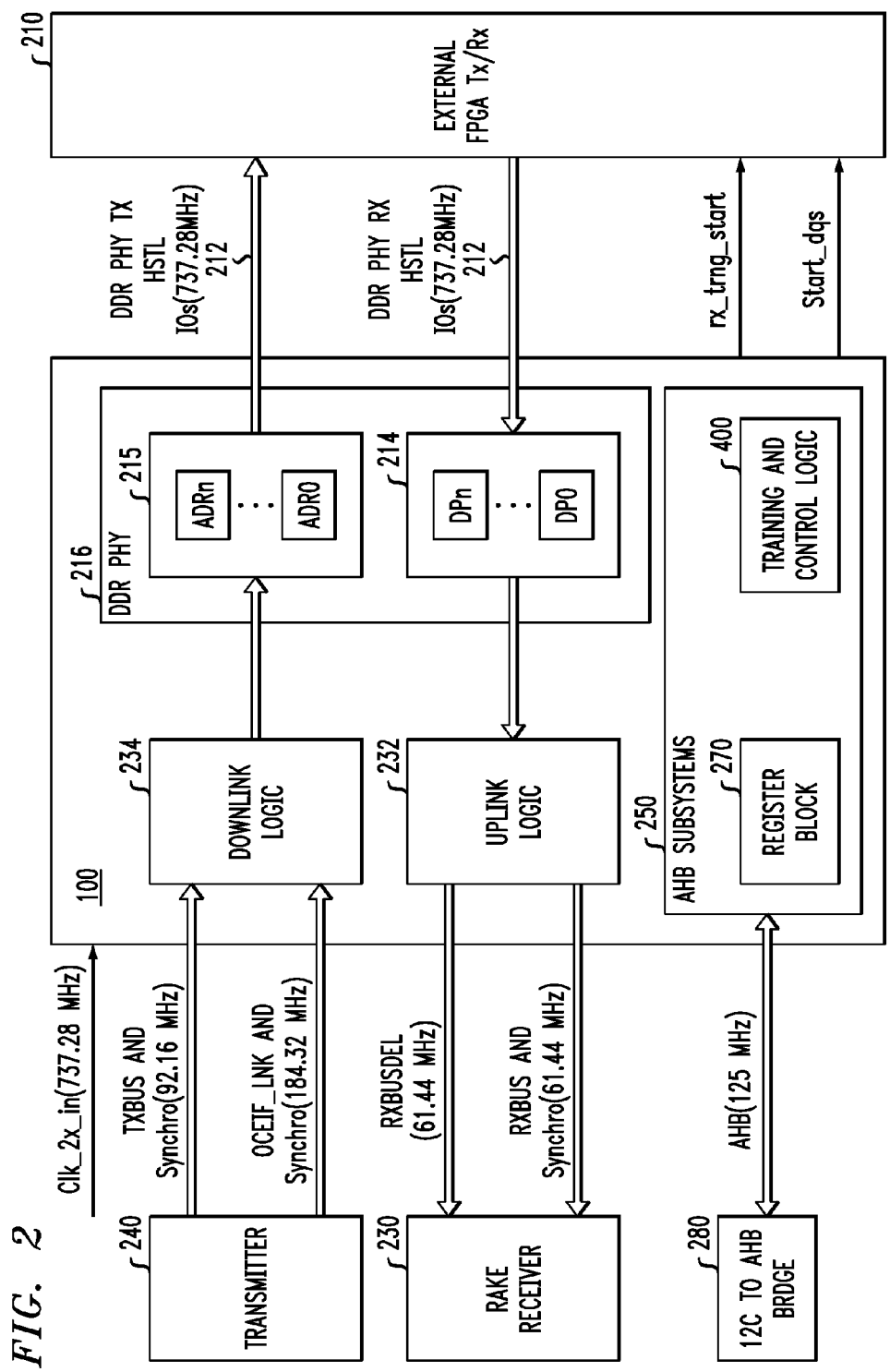
FIG. 2 illustrates an exemplary implementation of the high speed interface of FIG. 1 in further detail.

FIG. 2 illustrates an exemplary implementation of the high speed interface 100 in further detail. Portions of the exemplary high speed interface 100 may be implemented, for example, using a DDR PHY 216. As shown in FIG. 2, on the uplink side, the exemplary high speed interface 100 receives streaming data from a combiner/antenna 210 at a rate of 737 MHz over high speed links 212, parallelizes the data, performs a cyclic redundancy check (CRC) on the received data and provides the data to a RAKE receiver 230 at 61 MHz speed (uplink) using physical read datapaths (DP) 214 and uplink logic 232. The high speed links 212 may be implemented, for example, as HSTL links. The physical read datapaths (DPs) 214 may be configured to receive a respective portion of the read data signals DQ from the combiner/antenna 210 and a respective read data strobe signal or signals DQS associated with the respective portion of the received read data signals.

On the downlink side, the exemplary interface 100 receives streaming data from the transmitter 240 at rates of 92 MHz and 184 MHz, generates a CRC on the received data and transmits the data to the combiner/antenna 210 at 737 MHz speed (downlink), using downlink logic 234 and Address Path (ADR) hard macros 215 in the DDR PHY 216.

In one exemplary embodiment, three ADR12IO Hard macros (30 data bits and 3 clock pairs) of the DDR PHY 216 are dedicated for the downlink or transmit path and two DP8IO Hard macros (16 data bits and 2 clock pairs) are dedicated for the uplink or receive path.

According to one aspect of the invention, a hardware-based method is provided for training the high speed data links 212. The high speed data links 212 are trained to ensure that the word lock/synchronization within multiple data bits is achieved for the incoming continuous data stream. As discussed hereinafter, the disclosed hardware-based training method maintains the appropriate DQ-DQS timing relationship to provide, for example, an adequate setup and hold time margin within a data valid window. The phase alignment requires a handshake mechanism to control the start of the data streaming and training patterns. For example, for data streaming applications, the DQS strobe signal toggles continuously, and there needs to be a proper handshake after a reset between the interface and the DDR memory.

The training patterns can be predefined and/or programmable. The training patterns can be selected to cover single bit transitions that will train the link for the highest transition rate. In addition, training patterns can be selected to cover multi-bit transitions to train the link to receive continuous high or low values for multiple bit times.

As shown in FIG. 2, the high speed interface 100 further comprises a bus interface, such as an Advanced High Performance Bus (AHB) subsystem 250 having an AHB Interface 280 for handling register configuration. The AHB subsystem 250 comprises a set of registers 270 and a training and control logic block 400, as discussed further below in conjunction with FIG. 4, to provide the data eye training, controllability of the handshaking signals and configurability of the DDR PHY 216. As discussed hereinafter, the training and control logic block 400 contains training finite machines (FSMs).

On the uplink or the receive side, two handshake signals (rx_trng_start and start_dqs signal) are employed to maintain the phase alignment. The training and control logic block 400 sets an rx_trng_start signal to a logic high value to request the external FPGA Tx/Rx device 210 to send a predefined training sequence, such as a 48 bit training sequence, over the high speed data links 212. On the uplink side, the DQS signal starts toggling and the training pattern is sent by the external FPGA device (such as a combiner) 210 when the signal rx_trng_start rises. The control of the handshake signal rx_trng_start is discussed further below in conjunction with FIGS. 3 and 4.

The first bit of the training data is aligned to the rising edge of the DQS signal. The DOS signal stops toggling after 48 bits of training pattern is transmitted during the training phase. When the start_dqs signal is asserted by the interface 100, the DQS signal starts toggling along with the normal data pattern. In this manner, the two handshake signals turns on and off the DQS toggling to make sure that the training pattern or the normal data is phase aligned.

As discussed hereinafter, an aspect of the present invention employs a predefined or programmable set of data patterns during the data eye training. The data patterns can be selected, for example, to cover single bit transitions that will train the link for highest transition rate; cover multi-bit transition to train the link to receive continuous high or low values for multiple hit times; and ensure there is no false data eye window.

Figure 3:
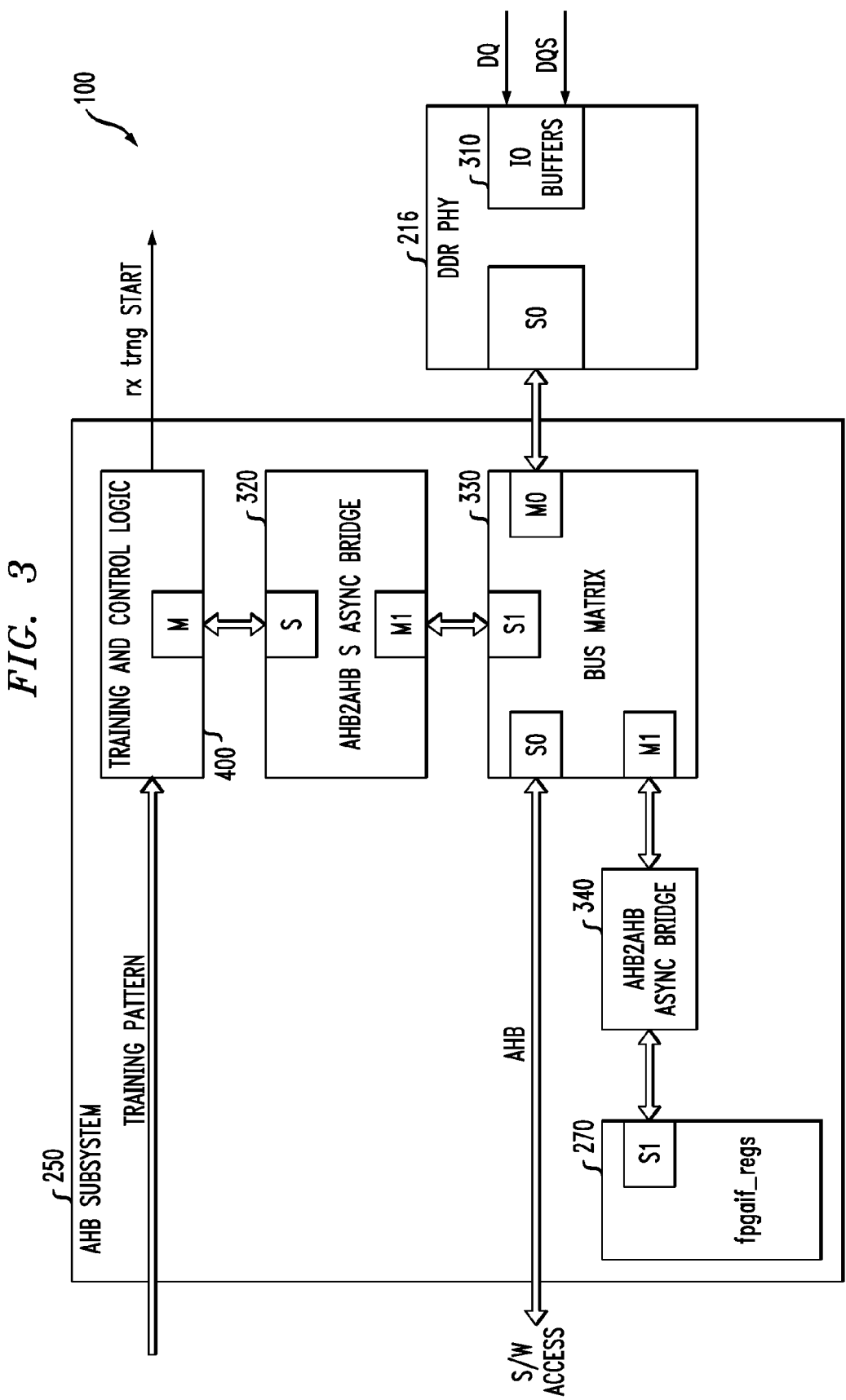
FIG. 3 illustrates an exemplary implementation of the high speed interface in further detail.

FIG. 3 illustrates an exemplary implementation of the high speed interface 100 in further detail. As shown in FIG. 3, the exemplary AHB subsystem 250 further comprises a bus matrix 330 to facilitate communication between the training and control logic 400, DDR PHY 216 and the register blocks 270. In addition, a bridge 320 connects the training and control logic 400 to the bus matrix 330, and a bridge 340 connects the register blocks 270 to the bus matrix 330, I/O buffers 310 are provided between the DDR PHY 216 and the external device 210. Although the I/O buffers 310 are shown in FIG. 3 as being part of the DDR PHY 216, the I/O buffers 310 may in fact be distinct from the DDR PHY 216, as would be apparent to a person of ordinary skill in the art.

Generally, the training and control logic 400 accesses delay registers in the DDR PHY 216 via the AHB interconnect (bridges 320 and bus matrix 330). A processor (software) can access all the registers 270, for example, through an exemplary S0 interface of the bus matrix 330. In this manner, a software-based training method can also be provided. Software can also configure the training and control logic 400 based on the system skew and jitter and the software can also reset the training and control logic 400 to recover from any error condition.

Figure 4:
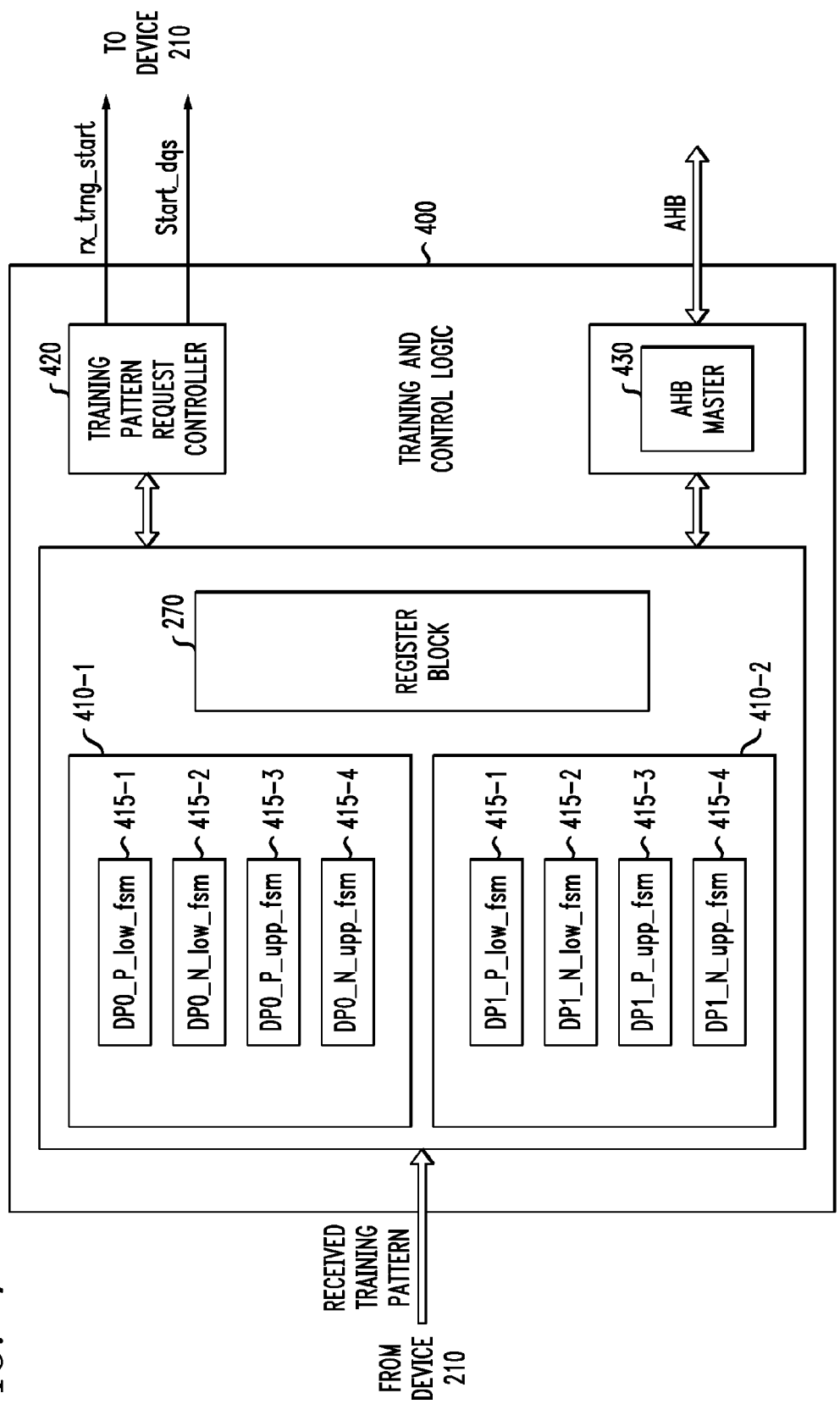
FIG. 4 illustrates the training and control logic of FIGS. 2 and 3 in further detail.

FIG. 4 illustrates the training and control logic 400 in further detail. As previously indicated, an exemplary embodiment employs two datapath (DP) hard macros (16 data hits 2 clock pairs) for the uplink or receive path. Each exemplary DP Hardmacro of the DDR PHY 216 (FIG. 2) has a corresponding data eye training finite state machine (FSM) 410-1, 410-2 that adjusts four delay registers within the read datapaths 214 that need to be programmed in accordance with the present invention in order to find the center of the data eye. Thus, as shown in FIG. 4, each exemplary DP Hardmacro of the DDR PHY 216 (FIG. 2) has a corresponding data eye training FSM 410-1, 410-2 running in parallel and each exemplary data eye training FSM 410-1, 410-2 adjusts the delay of four delay registers in the read datapaths 214.

According to one aspect of the invention, the data eye training by the exemplary data eye training FSMs 410-1 and 410-2 is performed in parallel. Generally, this parallelism makes the disclosed data eye training significantly faster than existing software-based techniques. A training pattern request controller 420 regulates training pattern requests to get the training pattern from the external device 210.

Generally, an AHB master 430 performs the write operation to the delay registers in DDR PHY 216. The delay values and corresponding control information are provided by the data eye training FSMs 410 during the training operation.

Data Eye Centering

As previously indicated, the present invention provides hardware-based techniques for training the high speed data links 212 (FIG. 2). The exemplary disclosed hardware-based method for calibrating a data valid window is implemented in the training and control logic 400.

FIG. 5A illustrates exemplary DQ and DQS signals for the situation where the DQS signal is leading the DQ signal. As indicated above, the combiner/antenna 210 drives the DQS and DQ bits. Thus, the same skew and jitter applies to both DQS and DQ lines.

In one exemplary implementation, it has been found that the total uncertainty on the DQS and DQ signals is 567 ps (329 ps of skew 520 from combiner/antenna 210 plus 238 ps of jitter 530 from the PCB board where the chips are physically mounted and from the DDR PHY 216). In addition, the exemplary implementation exhibits a duty cycle distortion 540 of 160 ps from the external FPGA tx/rx 210. In the presence of a duty cycle distortion 540 of 160 ps, the DQS falling edge and associated DQ data availability is reduced by 160 ps. After accounting for the total exemplary uncertainty on the DQS and DQ signals, and when the total period (between adjacent rising edges, for example, of the DQS signal) is 2.712 ns, the size of the data valid window 510 is 391 ps. It is noted that data should be sampled only within the 1.356 ns period of the DQ signal. Generally, the exemplary disclosed hardware-based calibration method aims to maintain the rising and falling edges of the DQS signal within the data valid window 510 by shifting the DQS signal by a phase shift 560.

Figure 5B:
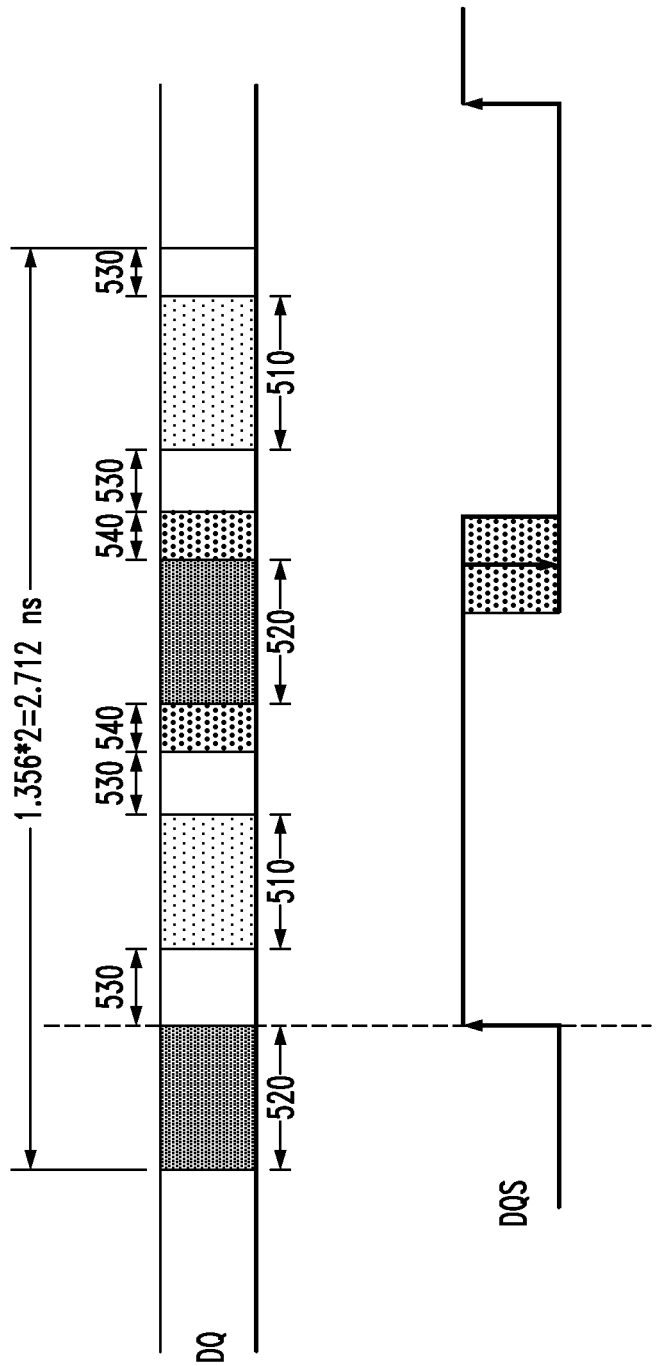

FIG. 5B illustrates exemplary DQ and DQS signals for the situation where the DQS signal is lagging the DQ signal.

Figure 6:
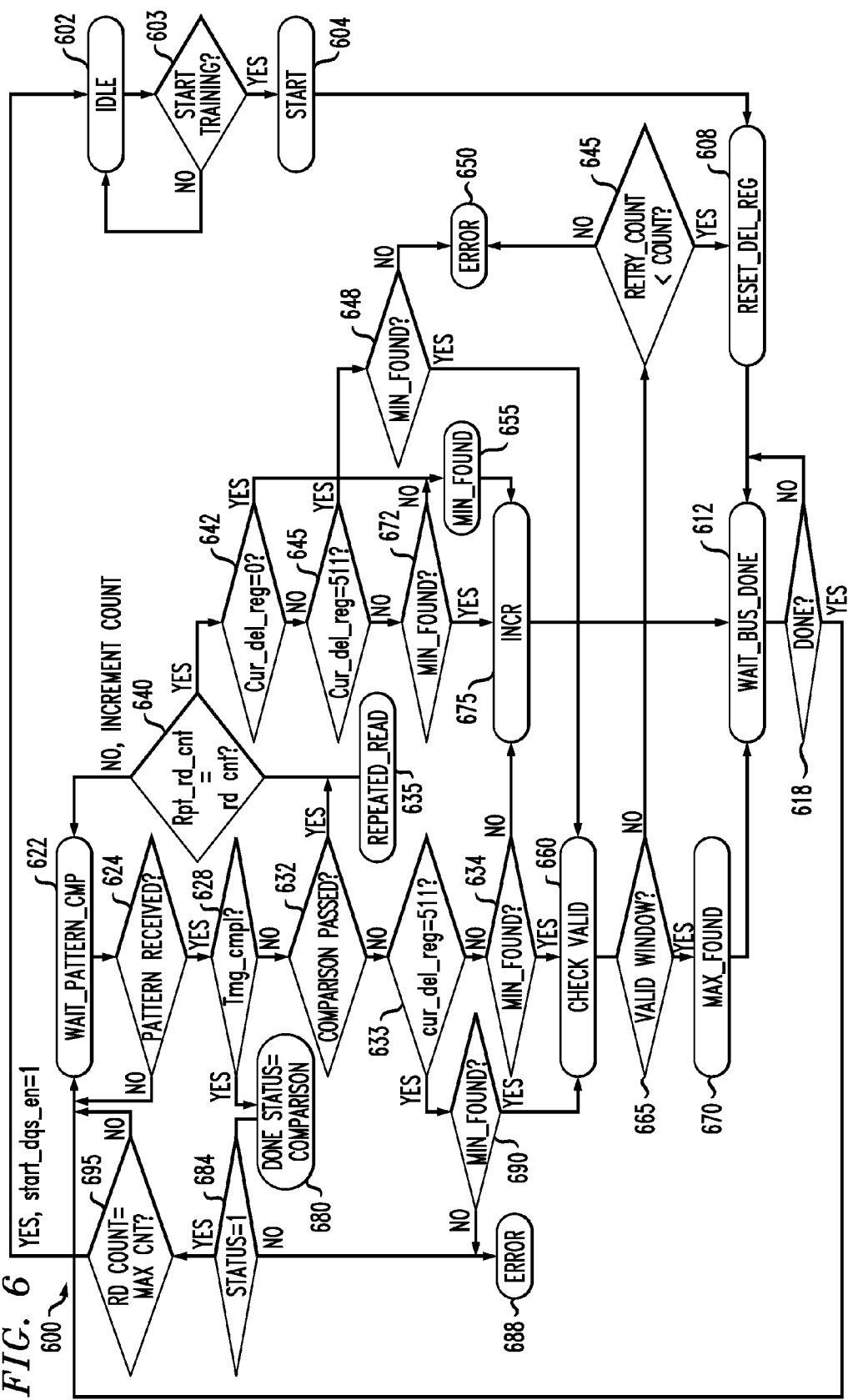
FIG. 6 is a state diagram describing an exemplary implementation of a data eye centering finite state machine incorporating features of the present invention.

FIG. 6 is a state diagram describing an exemplary implementation of a data eye centering finite state machine 600 incorporating features of the present invention. As previously indicated, in one embodiment, the data eye centering FSM 600 is implemented as a finite state machine.

Generally, as discussed hereinafter, the exemplary data eye centering FSM 600 comprises the following steps.

1. Reset the DQS delay register to 0.
2. Find fail to pass point: At every delay step do a maximum of 256 read operations and if data mismatches, increment the delay. The first point where data matches for 256 reads is saved as the left most point.
3. Once the left most point is found, increment delay and at each delay step do 256 read operations. If data matches, increment the delay, else if data mismatches check if the eye window meets the requirement. If it meets the requirement, save this point as the right most point of the eye. If it does not meet the requirement, clear the left most point saved earlier and go back to step 2 and start from the current delay.
4. When both left most and right most points are determined, calculate and set the middle of the eye, and do a repeated read using established mid-point. Set error bit, if left most or right most point can't be found.

As shown in FIG. 6, the exemplary data eye centering FSM 600 initially exits an IDLE state 602 and enters a start state 604 when it is determined at condition 603 that initialization is complete, training is not complete and an error has not occurred. It however, it is determined at condition 603 that initialization is not complete, training is complete or an error has occurred, then a retrain is performed at IDLE state 602. During the start state 604, the following exemplary registers are reset:

CUR_DEL_REG (contains the current delay value for each delay register of DP hardmacro 214 in the DDR PHY 216);

LEFT_EYE_REG (contains the delay value of the left most point of the eye);

RIGHT_EYE_REG (contains the delay value of the right most point of the eye); and VALID_EYE_WD_REG (contains Width of the valid eye window that is achieved).

Following state 604, program control proceeds to a RESET DEL_REG state 608, which comprises the following steps:

Clear min_found flag;

Clear VALID_EYE_WD_REG; and

Enable AHB Write to delay registers in PHY.

Following state 608, a WAIT_BUS_DONE state 612 waits for writes to complete. When it is determined at state 618 that the writes have completed, a WAIT_PATTERN_CMP state 622 waits for a pattern to be received. When it is determined at state 624 that a pattern has been received, a further test at state 628 determines if training is complete. If training is complete, a DONE state 680, discussed below, is entered.

If training is not complete, a state 632 determines if the comparison passed. If the comparison passed, a Repeated_Read state 635 is performed to eliminate jitter effects and increments the rpt_rd_count and returns to state 622. The repeat count can be programmable.

An INCR state 675 increments CUR_DEL_REG by one if its previous value is less than 511; enables AHB Write to delay registers in PHY; and clears the rpt_rd_count register. It is noted that in the exemplary embodiment, the delay register of the DDR PHY 216 is 9 bits wide. Thus, the exemplary maximum delay step count is 511.

A MIN_FOUND state 655 finds a fail-to-pass point and comprises the following steps:

LEFT_EYE_REG=CUR_DEL_REG;

Set flag min_found; and

Clear rpt_rd_count register.

A Check_Valid state 660 checks if the valid eye window is achieved and updates the VALID_EYE_WD_REG register.

A MAX_state 670 comprises the following steps:

RIGHT_EYE_REG=CUR_DEL_REG;

Center of the eye=(LEFT_EYE_REG RIGHT_EYE_REG)/2;

Set training complete flag; and

Clear rpt_rd_count register.

An Error state 688 sets error flags when a valid center of the eye cannot be found.

According to a further aspect of the invention, an Error Recovery mechanism is also provided. The state of the FSM can be reset to IDLE by software in the event of a hang condition or any Error scenario. The current state of the FSM can be read by the software. Software can choose to retrain any particular or all the FSMs in case valid eye window is not satisfactory or there is an error. Acceptable Valid eye window is configurable. Number of retries in case valid window is not found is configurable. The error flags are registered which can be read by the software. Capability of eye training through software is also provided.

Figure 7:
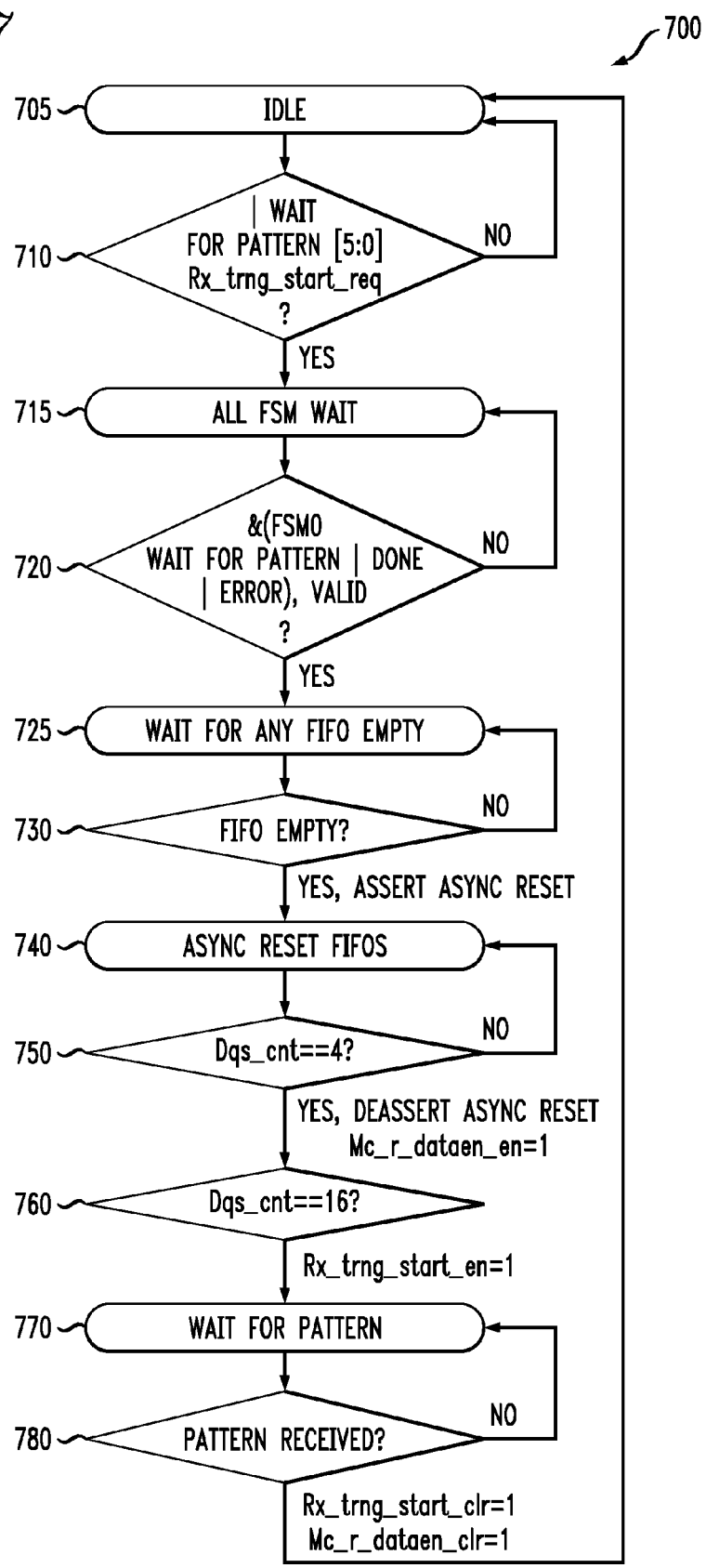
FIG. 7 is a state diagram describing an exemplary implementation of a training pattern request control finite state machine incorporating features of the present invention.

FIG. 7 is a state diagram describing an exemplary implementation of a training pattern request control finite state machine 700 incorporating features of the present invention. As previously indicated, in one embodiment, training pattern request control FSM 700 is implemented as a finite state machine. Generally, the exemplary training pattern request control FSM 700 controls all of the data eye training FSMs.

As shown in FIG. 7, the exemplary training pattern request control FSM 700 is initiated in a default IDLE state 705. When any of the eye training FSMs is in the wait-for-pattern state 622 (as determined at state 710), control moves to ALL_FSM_WAIT state 715.

During the ALL_FSM_WAIT state 715, a check is performed at state 720 to determine if all the eye training FSMs are either in the wait-for-pattern state 622 or error state 650 or Done state 680 and control moves to state 725 to wait for any FIFO empty state. If yes, all the Rx FIFOs are cleared at state 740. Then, the FSM 700 waits at state 740 for 4 cycles and then asserts MC_R_DATA_EN signal in the DDR PHY and after 12 cycles (as determined at 760) the FSM 700 asserts a training pattern request to the external FPGA device 210 and moves to the wait-for-pattern state 770.

During the wait-for-pattern state 770, the FSM 700 waits for the patterns to be received. Once the patterns are received (as determined at 780), the FSM 700 deasserts the training request signal (rx_trng_start signal) and MC_R_DATA_EN signal of the DDR PHY, and moves to the IDLE state 705.

It is noted that the finite state machines described by the state diagrams of FIGS. 6 and 7 can be implemented using any hardware description language (HDL), such as the Verilog, HDL, as would be apparent to a person of ordinary skill in the art.

As previously indicated, the arrangements of the training control logic 400, as described herein, provide a number of advantages relative to conventional arrangements. As indicated above, the disclosed hardware-based techniques for training the data valid window for high speed links can be implemented in an environment where a controller or other processor is not available to execute the software-based calibration method or does not have access to the high speed data on the data links. Also, the disclosed hardware-based techniques can be employed even if a controller is available to reduce the time for date eye training, relative to software-based calibration methods.

Again, it should be emphasized that the above-described embodiments of the invention are intended to be illustrative only. In general, the exemplary hardware-based techniques for training the data valid Window can be modified, as would be apparent to a person of ordinary skill in the art.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

While FIGS. 6 and 7 show an exemplary sequence of states, it is also an embodiment of the present invention that the sequence may be varied. Various permutations of the FSMs are contemplated as alternate embodiments of the invention.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A method for calibrating a data valid window on one or more high speed links, comprising:
   determining an offset delay value for at least one datapath using a finite state machine, wherein said offset delay value is based on a maximum offset delay value and a minimum offset delay value for said at least one datapath; and
   delaying a read data strobe signal based upon a base delay and said offset delay value for said at least one datapath.

2. The method of claim 1, wherein said offset delay value is an average of said maximum offset delay and said minimum offset delay.

3. The method of claim 1, wherein said minimum offset delay value is obtained by setting a delay value of said at least one datapath to a predetermined value; evaluating a received pattern using said delay value; incrementing said delay value by a predetermined amount; and repeating the steps of evaluating and incrementing until said evaluation test passes.

4. The method of claim 1, wherein said maximum offset delay value is obtained by setting a delay value of said at least one datapath to a predetermined value; evaluating a received pattern using said delay value; incrementing said delay value by a predetermined amount; and repeating the steps of evaluating and incrementing until the evaluation test fails.

5. The method of claim 4, wherein said predetermined value is the minimum offset delay value of claim 3.

6. The method of claim 3, wherein said received pattern comprises a predefined pattern.

7. The method of claim 3, wherein said received pattern comprises a programmable pattern.

8. The method of claim 3, wherein said received pattern covers single-bit transitions.

9. The method of claim 3, wherein said received pattern covers multi-bit transitions.

10. The method of claim 1, further comprising the step of recovering from an error by returning to an idle state.

11. The method of claim 1, further comprising the step of providing a state of said finite state machine upon request.

12. The method of claim 1, further comprising the step of retraining said finite state machine if one or more predefined conditions are satisfied.

13. The method of claim 1, further comprising the step of calibrating a data valid window for at least a second datapath substantially in parallel to said at least one datapath.

14. A training control logic circuit for calibrating a data valid window, comprising:
 a finite state machine for determining an offset delay value for at least one datapath, wherein said offset delay value is based on a maximum offset delay value and a minimum offset delay value for said at least one datapath; and
 means for delaying a read data strobe signal based upon a base delay and said offset delay value for said at least one datapath.

15. The training control logic circuit of claim 14, wherein said offset delay value is an average of said maximum offset delay and said minimum offset delay.

16. The training control logic circuit of claim 14, wherein said minimum offset delay value is obtained by setting a delay value of said at least one datapath to a predetermined value; evaluating a received pattern using said delay value; incrementing said delay value by a predetermined amount; and repeating the evaluating and incrementing until said evaluation test passes.

17. The training control logic circuit of claim 14, wherein said maximum offset delay value is obtained by setting a delay value of said at least one datapath to a predetermined value; evaluating a received pattern using said delay value; incrementing said delay value by a predetermined amount; and repeating the evaluating and incrementing until the evaluation test fails.

18. The training control logic circuit of claim 17, wherein said predetermined value is the minimum offset delay value of claim 16.

19. The training control logic circuit of claim 16, wherein said received pattern comprises one or more of a predefined pattern and a programmable pattern.

20. The training control logic circuit of claim 16, wherein said received pattern covers one or more of single-bit transitions and multi-bit transitions.

21. The training control logic circuit of claim 14, wherein said finite state machine recovers from an error by returning to an idle state.

22. The training control logic circuit of claim 14, wherein said finite state machine provides a state upon request.

23. The training control logic circuit of claim 14, wherein said finite state machine is retrained if one or more predefined conditions are satisfied.

24. The training control logic circuit of claim 14, wherein a data valid window for at least a second datapath is calibrated substantially in parallel to said at least one datapath.

25. The training control logic circuit of claim 14, wherein said training control logic circuit is embodied on an integrated circuit.

26. A training control logic circuit for calibrating a data valid window, comprising:
 a finite state machine for (i) determining an offset delay value for at least one datapath, wherein said offset delay value is based on a maximum offset delay value and a minimum offset delay value for said at least one datapath, and (ii) delaying a read data strobe signal based upon a base delay and said offset delay value for said at least one datapath; and
 a training pattern request controller for obtaining a training pattern from an external device.

* * * * *